US007244516B1

(12) United States Patent
Sakamoto et al.

(10) Patent No.: US 7,244,516 B1

(45) Date of Patent: Jul. 17, 2007

(54) ORGANIC ELECTROLUMINESCENCE DEVICE

(75) Inventors: Yukinari Sakamoto, Kanagawa (JP); Mari Ichimura, Kanagawa (JP); Mitsuhiro Kashiwabara, Kanagawa (JP); Shinichiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 10/856,043

(22) Filed: May 28, 2004

(30) Foreign Application Priority Data

May 29, 2003 (JP) .......................... P2003-152189

(51) Int. Cl.
*H01J 1/62* (2006.01)
*C09K 11/06* (2006.01)

(52) U.S. Cl. ................ 428/690; 428/917; 252/301.16; 257/40; 257/102; 257/103; 548/440; 549/43; 549/460

(58) Field of Classification Search ................ 428/690, 428/917; 313/504, 506; 257/40, 102, 103; 252/301.16; 548/440, 43, 460
See application file for complete search history.

(56) References Cited

U.S. PATENT DOCUMENTS 6,852,429 B1 * 2/2005 Li et al. ..................... 428/690
2004/0076853 A1 * 4/2004 Jarikov ....................... 428/690

FOREIGN PATENT DOCUMENTS

JP 06-158038 6/1994

(Continued)

OTHER PUBLICATIONS

Yu Liu, et al. "*Highly Efficient White Organic Electroluminescence from a Double-Layer Device Based on a Boron Hydroxyphenylphridine Complex*" Angew. Chem. Int. Ed. 2002, 41, No. 1, pp. 182-184.

*Primary Examiner*—Rena Dye
*Assistant Examiner*—Carnie S. Thompson
(74) *Attorney, Agent, or Firm*—Bell, Boyd & Lloyd LLP

(57) ABSTRACT

An organic electroluminescence device including an organic layer having a light emission region and being disposed between an anode and a cathode is provided. The organic layer contains, as an organic light-emitting material, a compound represented by the following formula (1):

(1)

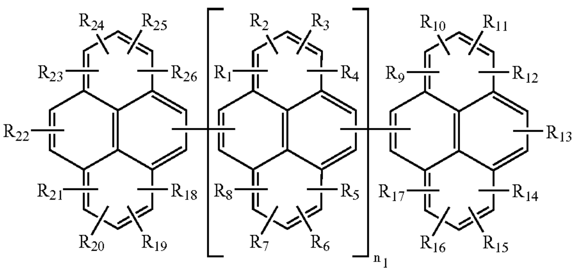

wherein each of $R_1$ to $R_{26}$ represents a substituents, such as a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, and a carboxyl group, and $n_1$ is a numeric value from 1 to 3.

9 Claims, 3 Drawing Sheets

FOREIGN PATENT DOCUMENTS

| | | |
|---|---|---|
| JP | 07-065958 | 3/1995 |
| JP | 07/142169 | 6/1995 |
| JP | 09/208946 | 8/1997 |

* cited by examiner

F I G. 5
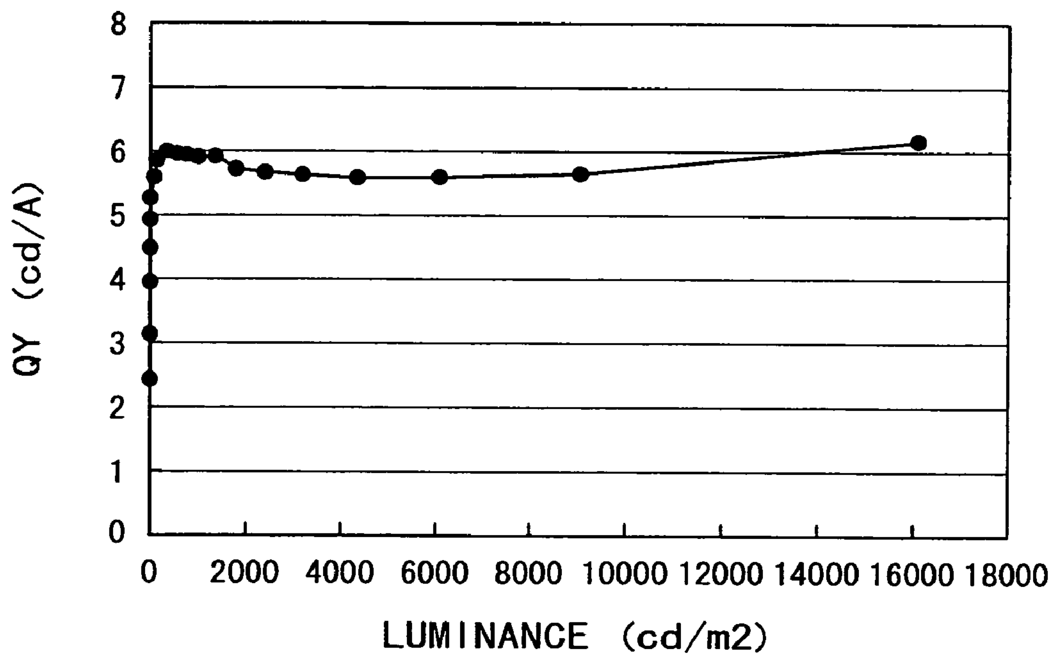

ORGANIC ELECTROLUMINESCENCE DEVICE

CROSS REFERENCES TO RELATED APPLICATIONS

This application claims priority to Japanese Patent Application No. P2003-152189, filed on May 29, 2003, the disclosure of which is incorporated by reference herein.

BACKGROUND OF THE INVENTION

The present invention generally relates to an organic electroluminescence device. More specifically, the present invention relates to an organic electroluminescence device having a layered structure and emitting white or substantially white light.

An organic electroluminescence device is a device which itself emits light, and has features such that it can emit light with wide viewing angle and high luminance and can be reduced in thickness, and therefore, application of the device to next-generation flat display or its flat light source has attracted attention. The method for achieving full-color display using the organic electroluminescence device may be roughly classified into the following three methods.

The first one is a method in which light emitting portions respectively for red (R), green (G), and blue (B) are formed on a flat surface, for example, by a resistance heating deposition method using a metal mask. In the manufacturing process for this display, RGB, i.e., three types of elements (subpixels) are individually formed on the same substrate and combined to form one pixel. Therefore, there is a need to prepare a deposition mask having a fine pattern for pixels and align it on the substrate with high accuracy. This can be problematic in that the productivity is low and the cost is high in the manufacturing process.

The second one is a method in which full-color display is made using an organic light-emitting layer which emits monochromatic light, for example, blue light, and a color changing layer, provided on the forward side as viewed in the light emitting direction, for changing the blue light to red or green light.

The third one is a method in which light emitted from an organic electroluminescence device emitting white light is divided into RGB using a color filter. In the method of obtaining arbitrary light by using the white-light emitting layer and the color filter in combination, there is no need to align a deposition mask to produce individual colors of light, and therefore the number of manufacturing steps may be reduced, making it possible to improve the productivity in the manufacturing process and suppress the cost.

Examples of methods for obtaining white light emission include: (1) a method using RGB light emitting layers in combination; (2) a method for allowing a single or a plurality of light emitting layers to emit light having two wavelengths which have the relationship of complementary colors, such as, bluish green and red light, or blue and yellow to orange light; and (3) a method utilizing exciplex emission. As the method (1) above, a method in which blue-, green-, and red-light emitting layers are stacked on one another to obtain white light has been proposed (see, Japanese Patent Application Publication No. 07-142169). The method (2) above includes a method in which two light-emitting layers for individual colors are stacked (see, Japanese Patent Application Publication No. 06-158038 and 07-65958), a method in which emission of two colors of light is obtained from a single light emitting layer (see, Japanese Patent Application Publication No. 09-208946), and the like. As the method (3) above, a white-light device using a boron-hydroxyphenylpyridine complex (see, Angew. Chem. Int. Ed. 2002, 41, No. 1) and the like have been reported.

SUMMARY OF THE INVENTION

The present invention generally relates to an organic electroluminescence device. More specifically, the present invention relates to an organic electroluminescence device having a layered structure and emitting white or substantially white light.

It is desirable to provide an organic electroluminescence device whose productivity is higher and which has a layered structure that can emits white or substantially white light and is less complex in structure pursuant to an embodiment of the present invention.

According to an embodiment of the present invention, there is provided an organic electroluminescence device which includes an organic layer having a light emission region and being disposed between an anode and a cathode. The organic layer contains, as an organic light-emitting material, a compound represented by the following formula (1) in an embodiment:

(1)

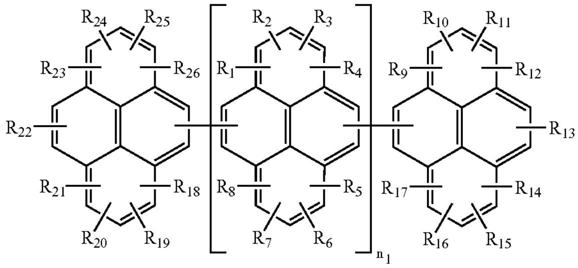

where each of $R_1$ to $R_{26}$ independently represents a substituents, such as a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, a carboxyl group, and the like and $n_1$ is a numeric value from 1 to 3.

According to another embodiment of the present invention, there is provided an organic electroluminescence device, wherein, in the formula (1) discussed above for the compound, each of $R_1$ to $R_{26}$ independently represents a substituent, such as a hydrogen atom, an alkyl group, an alkoxy group, an aromatic hydrocarbon group, an aromatic heterocyclic group and the like.

In an embodiment, the organic electroluminescence device emits white light.

In yet another embodiment of the present invention, there is provided an organic electroluminescence device which includes an organic layer having a light emission region and being disposed between an anode and a cathode. The organic layer contains, as an organic light-emitting material, a compound represented by the following formula (2):

(2)

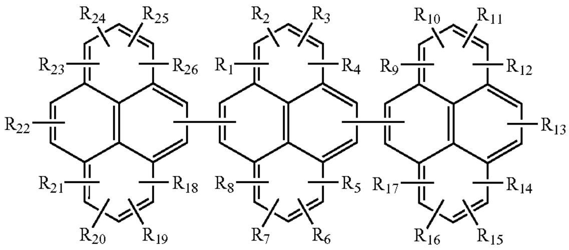

where each of $R_1$ to $R_{26}$ independently represents a substituents, such as a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, a carboxyl group and the like.

In still yet another embodiment of the present invention, there is provided an organic electroluminescence device, wherein, in the formula (2) discussed above for the compound, each of $R_1$ to $R_{26}$ represents a substituent, such as a hydrogen atom, an alkyl group, an alkoxy group, an aromatic hydrocarbon group, an aromatic heterocyclic group and the like. In an embodiment, the organic electroluminescence device emits white light.

In a further embodiment of the present invention, there is provided an organic electroluminescence device, wherein, as the compound represented by the formula (2) above, a compound represented by the following structural formula (3) is used:

(3)

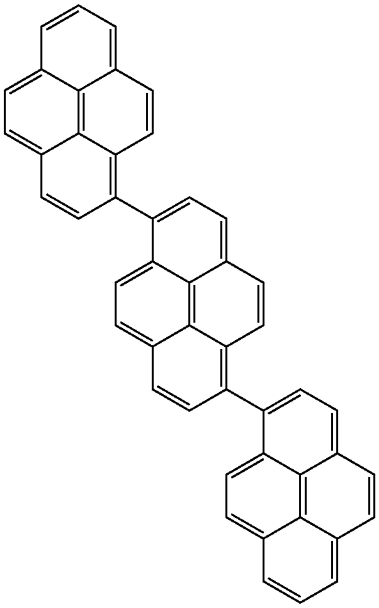

According to yet a further embodiment of the present invention, there is provided an organic electroluminescence device, wherein, as the compound represented by the formula (2) above, a compound represented by the following structural formula (4) is used:

(4)

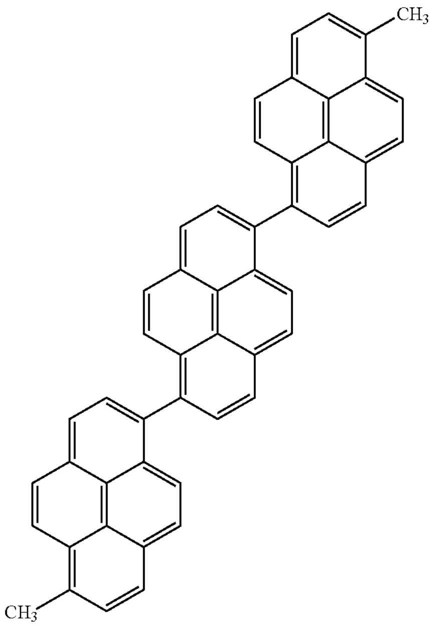

According to still yet a further embodiment of the present invention, there is provided an organic electroluminescence device, wherein, as the compound represented by the formula (2) above, a compound represented by the following structural formula (5) is used:

(5)

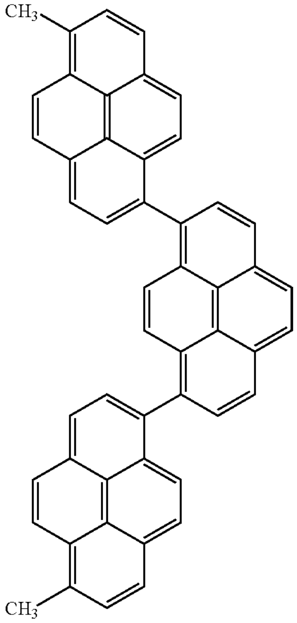

The compound represented by the formula (1) described an above in embodiment is a compound which itself emits white or substantially white light, namely, a single compound having respective peak tops in the RGB regions. Therefore, by passing light emitted from a light emitting material containing this compound through a color filter, the light may be divided into RGB individual pixels. Thus, an organic electroluminescence device having a simple layered structure can be prepared pursuant to an embodiment of the present invention.

Further, if an appropriate blue-light material is used as a host and the above light emitting material is used as a dopant to correct the B (blue) region, more complete white light may be obtained according to an embodiment.

According to an embodiment of the present invention, there may be provided an organic electroluminescence device whose productivity is higher and which has a simpler layered structure that can emits white or substantially white light.

Additional features and advantages of the present invention are described in, and will be apparent from, the following Detailed Description of the Invention and the figures.

BRIEF DESCRIPTION OF THE FIGURES

FIG. 5 is a diagram showing the result of a voltage-luminance measurement with respect to one example of an organic electroluminescence device according to an embodiment of the present invention.

DETAILED DESCRIPTION OF THE INVENTION

Figure 1:
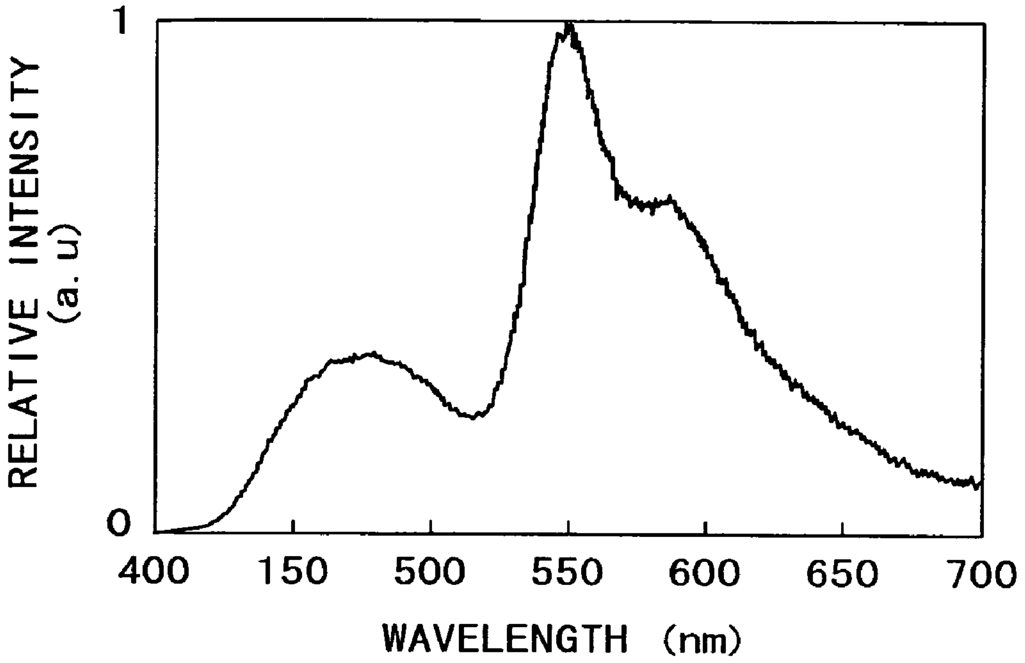
FIG. 1 is a diagram showing a fluorescence spectrum of the compound of the structural formula (3) used in an organic electroluminescence device according to an embodiment of the present invention.

The present invention generally relates to an organic electroluminescence device. More specifically, the present invention relates to an organic electroluminescence device having a layered structure and emitting white or substantially white light.

Various embodiments of the present invention will be described below in greater detail.

In an embodiment of the present invention, examples of an "organic layer having a light emission region" can include a two-layer type including a hole transport layer and a light emitting layer; a three-layer type including a hole transport layer, a light emitting layer, and an electron transport layer; a five-layer type including a hole injection layer, a hole transport layer, a light emitting layer, an electron transport layer, and an electron injection layer, and the like.

The phrase "the organic layer contains, as an organic light-emitting material, a compound" or other like terms means that the compound of the formula (1) is contained in at least one layer of the above-mentioned layers and contributes to the light emission. With respect to the use of the compound in an embodiment of the present invention in the organic layer, either the compound of the formula (1) may be solely used, or the compound of the formula (1) as a dopant and a host material may used in combination.

The compound used as an organic light-emitting material in an embodiment of the present invention is represented by the formula (1) wherein each of $R_1$ to $R_{26}$ independently represents a substituent, for example, a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, a carboxyl group, and the like and $n_1$ is a numeric value from 1 to 3. Preferably, each of $R_1$ to $R_{26}$ represents a substituent, such as a hydrogen atom, an alkyl group, an alkoxy group, an aromatic hydrocarbon group, an aromatic heterocyclic group and the like.

Further, in the formula (1) above, it is preferred that $n_1$ is 1. Corresponding to the formula (2) above, and, in this case, in the formula, each of $R_1$ to $R_{26}$ independently represents a substituent, such as a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, a carboxyl group and the like. It is preferred that each of $R_1$ to $R_{26}$ independently represents a substituent, such as a hydrogen atom, an alkyl group, an alkoxy group, an aromatic hydrocarbon group, an aromatic heterocyclic group and the like.

The number of carbon atoms contained in each of the alkyl group and the alkoxy group are 20 or less in an embodiment. The number of carbon atoms contained in each of the aromatic hydrocarbon group and the aromatic heterocyclic group are 30 or less in an embodiment. For example, the following compound represented by structural formulae (1-1) to (1-4) can be used for the alkoxy group, structural formulae (1-5) to (1-6) can be used for the aromatic hydrocarbon group (aryl group), and structural formulae (1-7) to (1-8) for the aromatic heterocyclic group according to an embodiment.

-continued
(1-1)
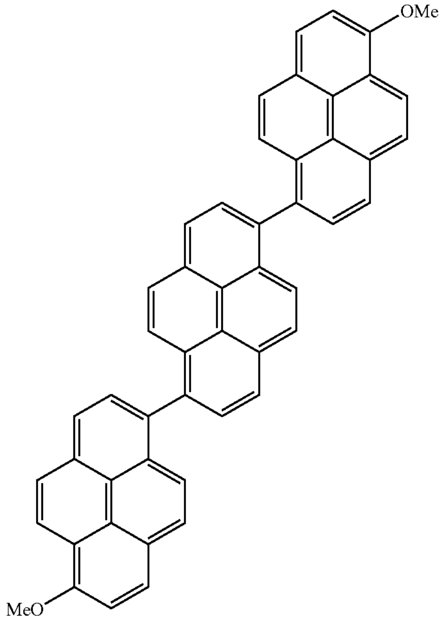
(1-2)
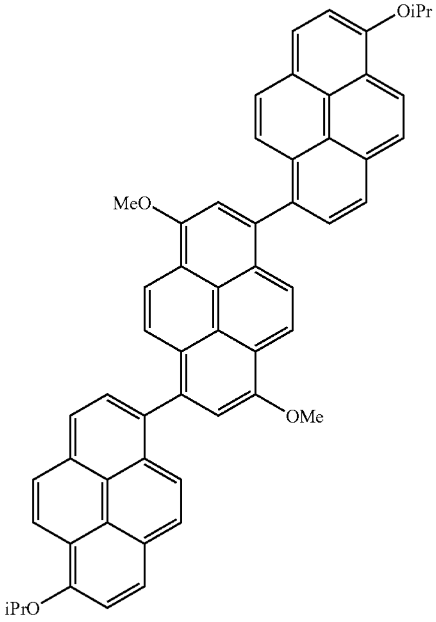
(1-3)
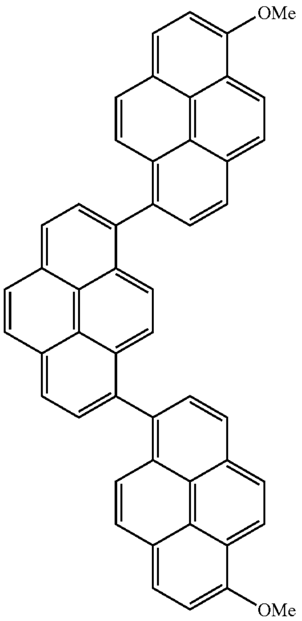
(1-4)
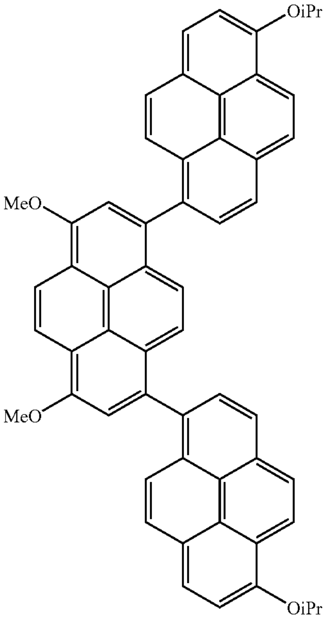
(1-5)
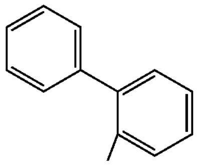

-continued
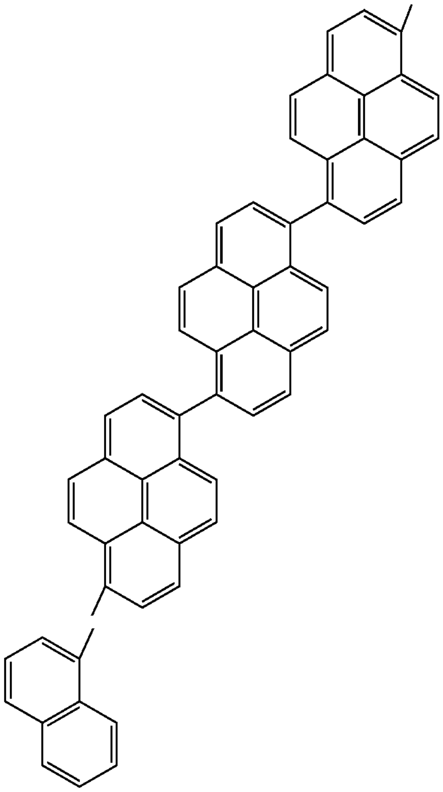
(1-6)
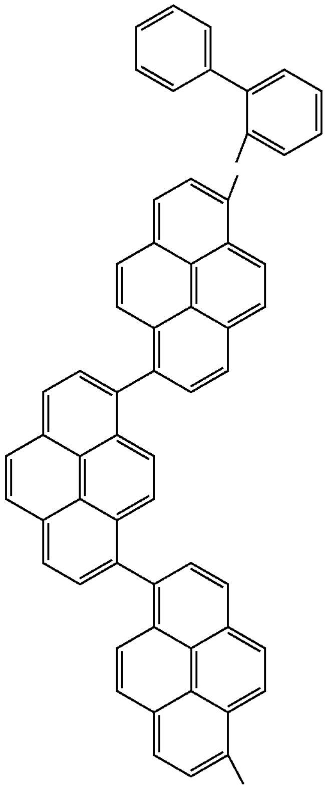
-continued
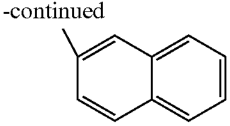
(1-7)
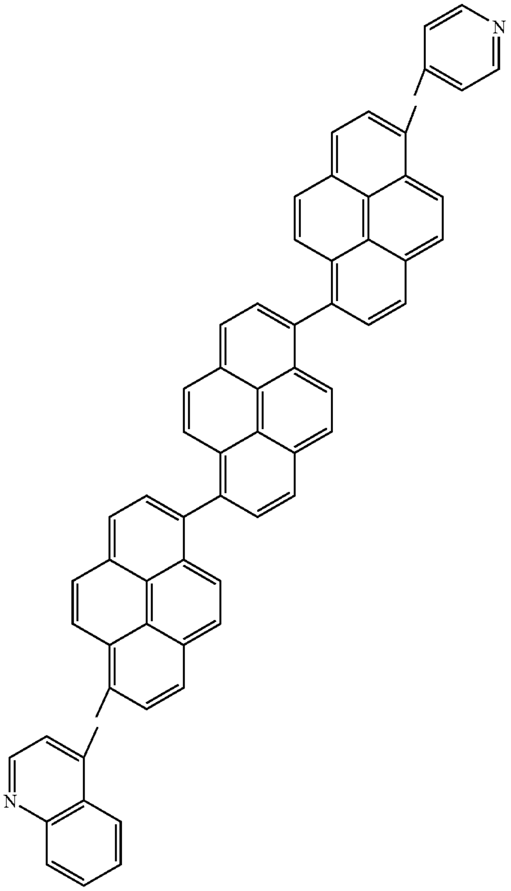
(1-8)
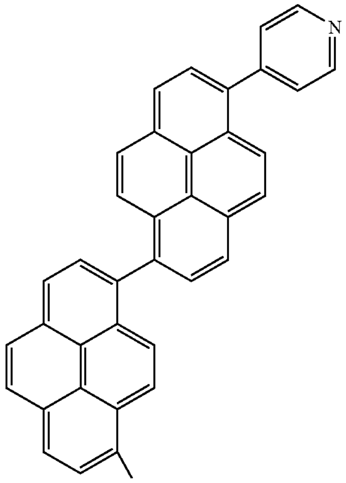

-continued
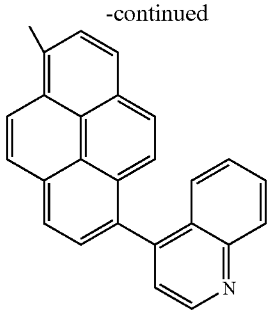
Further, in addition to the compounds represented by the structural formulae (3) to (5) discussed above, as examples of the compounds of the formula (2), compounds represented by the following structural formulae (6) to (30) can be used in an embodiment:
(6)
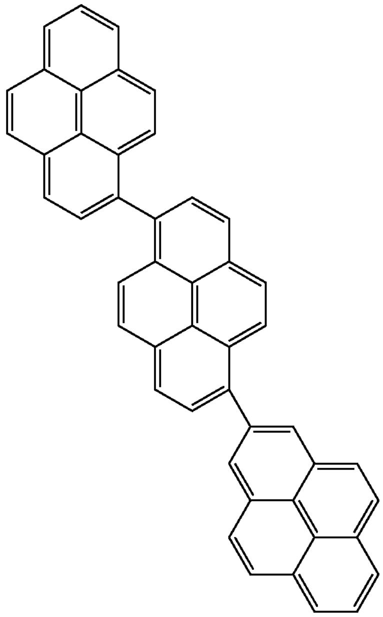
(7)
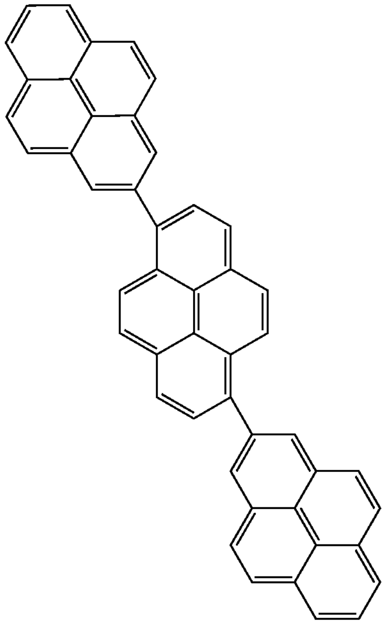
-continued
(8)
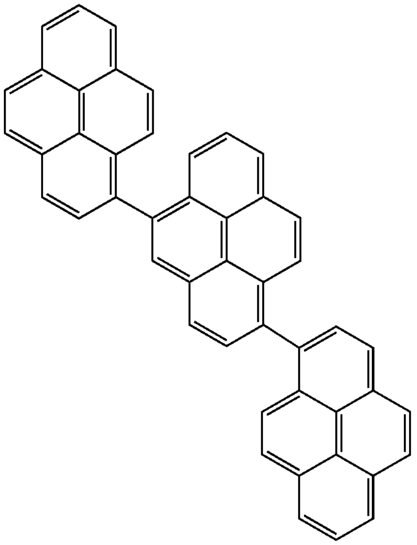
(9)
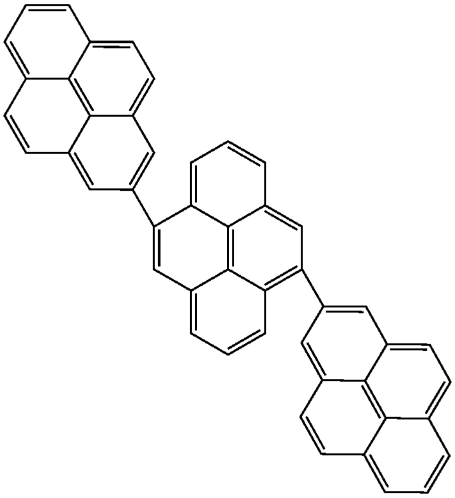
(10)
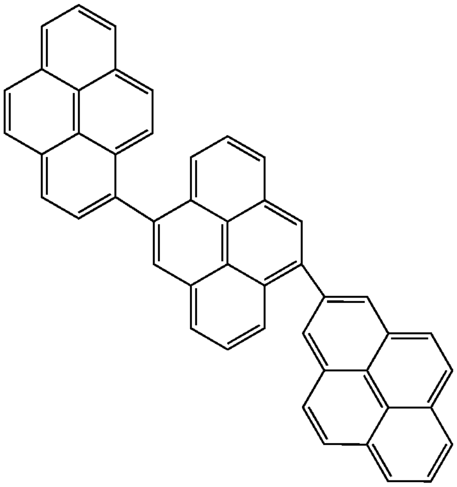

-continued
(11)
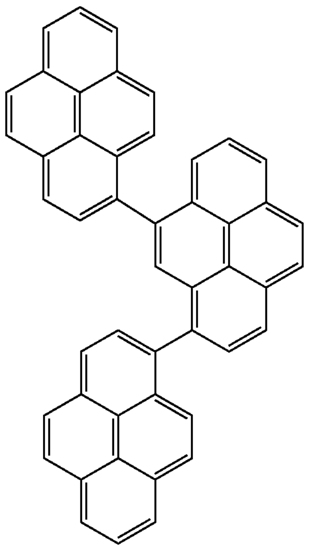
(12)
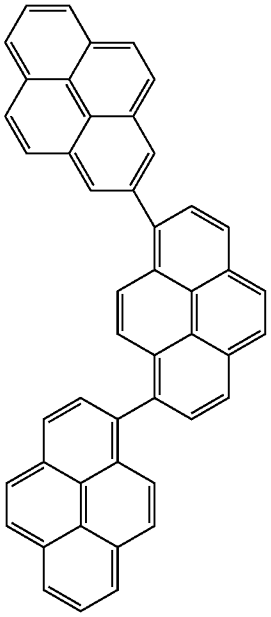
-continued
(13)
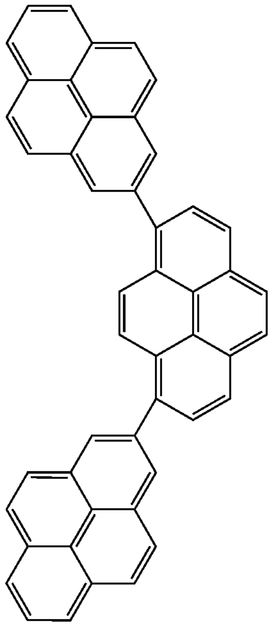
(14)
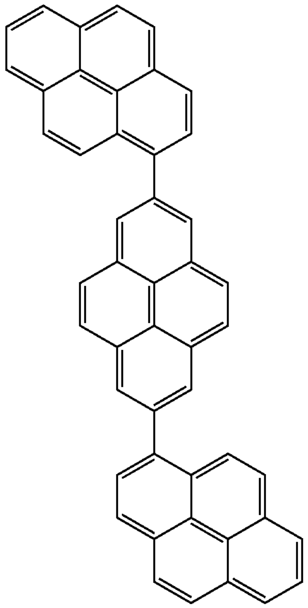

-continued
(15)
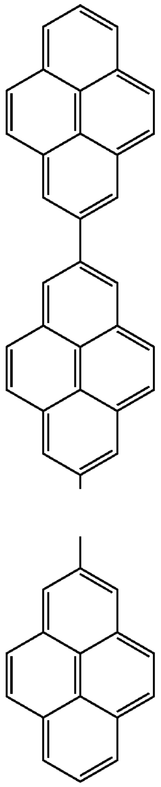
(16)
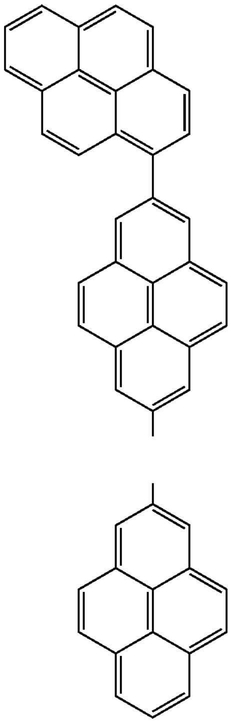
-continued
(17)
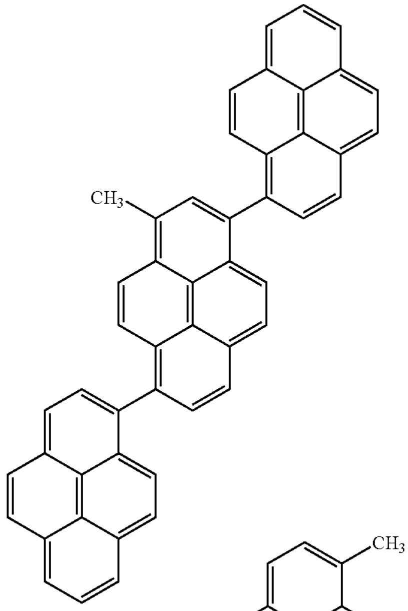
(18)
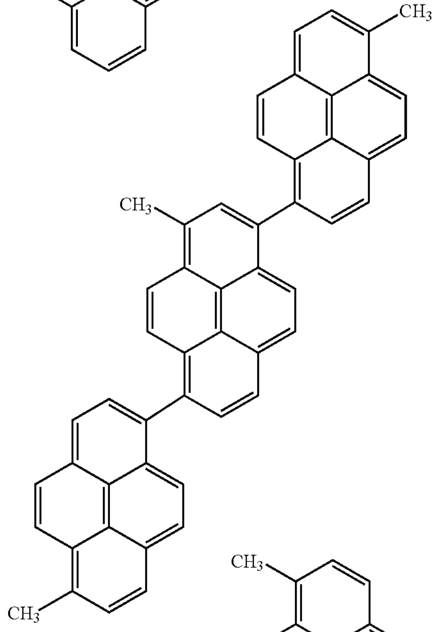
(19)
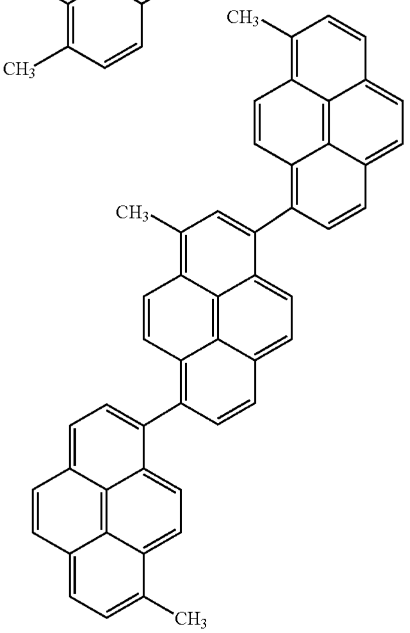

-continued
(20)
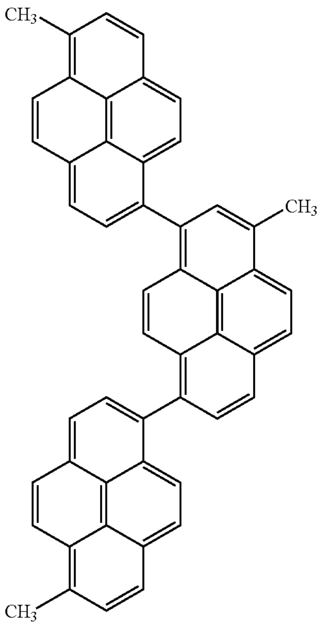
(21)
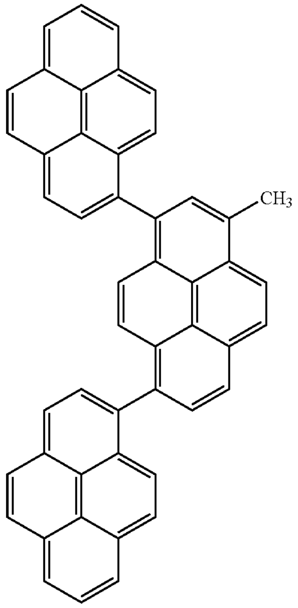
-continued
(22)
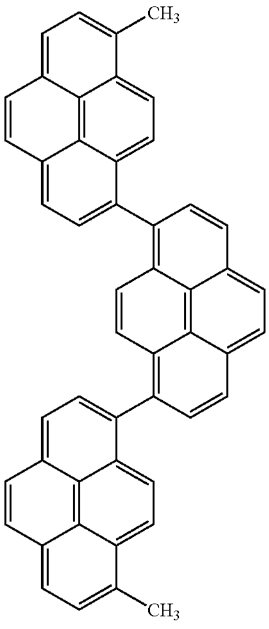
(23)
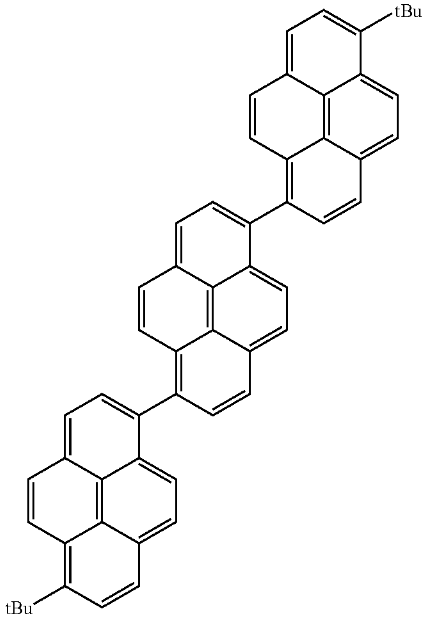

-continued
(24)
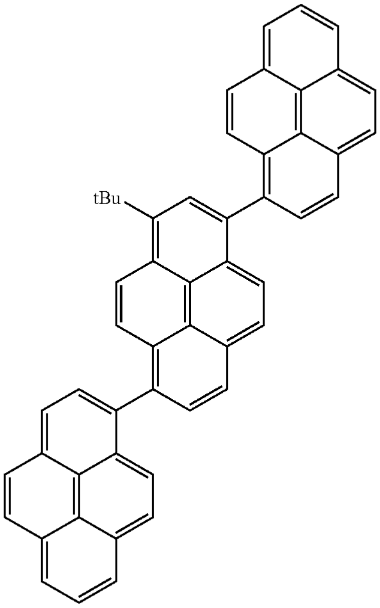
(25)
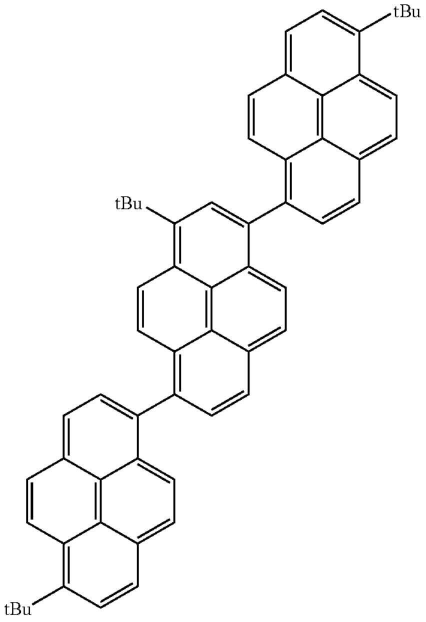
-continued
(26)
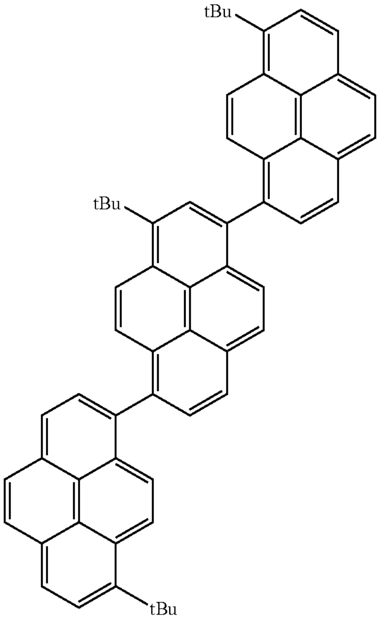
(27)
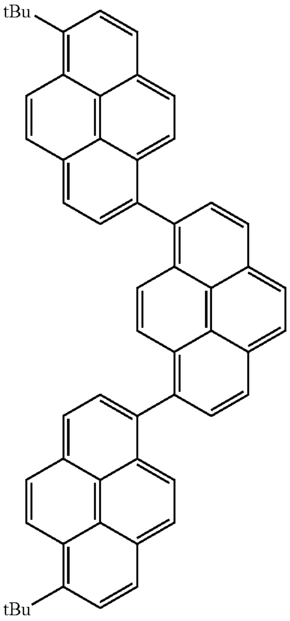

-continued (28)

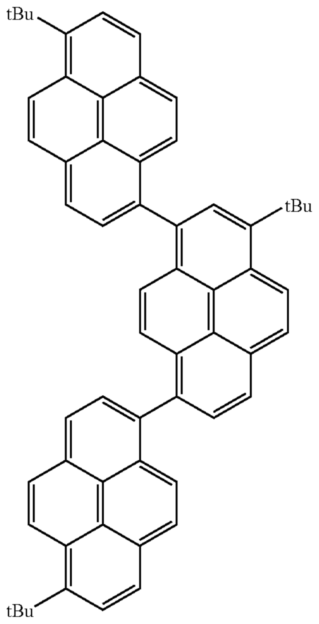

(29)

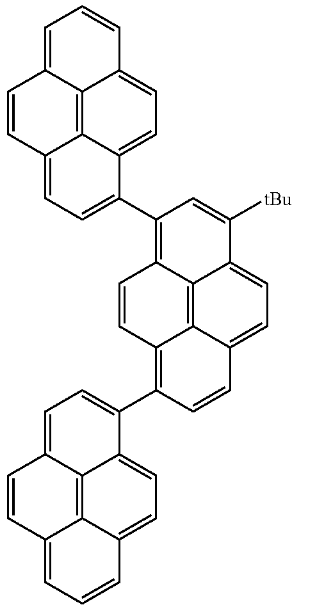

-continued (30)

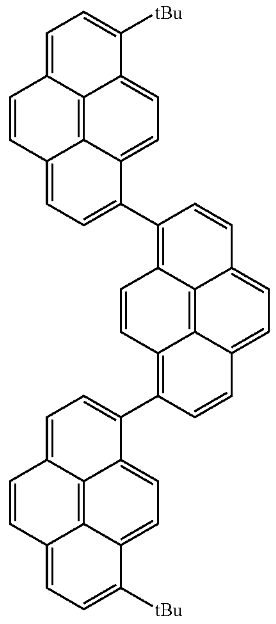

There is correlation between an emission spectrum of the organic electroluminescence device and a fluorescence spectrum of the organic light-emitting material. The compound represented by the formula (1) or (2), especially the group of compounds represented by the structural formulae (3) to (30) has characteristic fluorescence wavelengths having respective peak tops in the RGB regions. For example, a fluorescence spectrum of the compound of the structural formula (3) as a representative compound is shown in FIG. 1. As can be seen in FIG. 1, the compound has respective peak tops near the RGB regions, although the intensity in the B region is slightly low.

By passing light emitted from the organic light-emitting material through a color filter, the light can be divided into RGB. For example, by effecting a color filter on the organic electroluminescence device which includes the organic layer having a light emission region and being disposed between an anode and a cathode, wherein the light emitting layer contains, as the organic light-emitting material, at least one compound such as compounds represented by the formulae (1) and (2), especially the compounds represented by the structural formulae (3) and (6) to (16) wherein the light emitted from the device can be divided into RGB individual pixels.

Further, by effecting a color filter on the organic electroluminescence device which includes the organic layer having a light emission region and being disposed between an anode and a cathode, wherein the light emitting layer contains, as the organic light-emitting material, at least one compound, such as compounds represented by the formulae (1) and (2), especially the compounds represented by the structural formulae (3) and (6) to (16), wherein the intensities of RGB can be made at the same level in order to obtain white light.

The organic light-emitting material in an embodiment can be either solely used in the light emitting layer or used in combination with a blue-light emitting layer made of a blue-light material, which appropriately corrects the spectrum in the B (blue) region, to form a layered structure.

Alternatively, the organic light-emitting material can be the combination of a host material and a dopant. In this case, a light emitting material emitting blue light as a host and at least one light emitting material represented by the formula (1) as a dopant are used in combination in the light emitting layer to obtain white light. The light emitting layer can be of either a single layer or a layered structure having two or more layers.

The compound in an embodiment of the present invention is generally contained in the light emitting layer as mentioned above, but it may be contained in another layer in the organic layer having a light emission region.

According to the embodiment of the present invention, RGB light emission can be obtained from a single chemical species. Therefore, there is provided a light emitting device which stably emits light without causing color drift, resulting in remarkable advantages from the viewpoint of the technique and cost in the manufacturing process. Further, white light can be obtained from the device having a considerably simple layered structure.

Another embodiment of the present invention will be described below with reference to the drawings.

Figure 2:
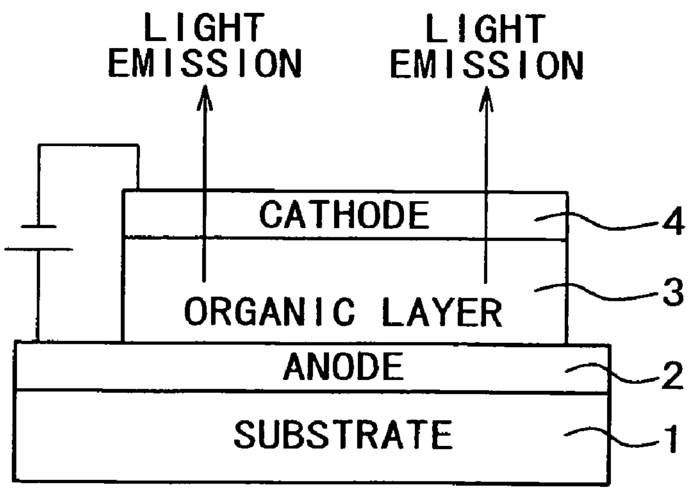
FIG. 2 is a diagrammatic cross-sectional view of one example of an organic electroluminescence device according to an embodiment of the present invention.

FIG. 2 is a diagrammatic cross-sectional view of one example of an organic electroluminescence device according to the present embodiment. The organic electroluminescence device includes an anode 2, an organic layer 3 having a light emission region, and a cathode 4, which are formed on a substrate 1 in this order from bottom. This organic electroluminescence device is a top emission type organic electroluminescence device which emits light from the side of the cathode.

In the substrate 1, glass, a plastic, or another material may be used if it is applicable. When the organic electroluminescence device and another display device are used in combination, the substrate 1 may be shared by them. As the anode 2, one having a layered structure including an indium tin oxide (ITO) layer can be used.

The organic layer 3 contains an organic light-emitting material represented by the formula (1) above. With respect to the organic layer 3, as the construction of layers for obtaining organic electroluminescence, various types of constructions conventionally known can be employed. For example, if the material constituting any one of the hole transport layer and the electron transport layer has light emission properties, a structure obtained by stacking thin films of the hole transport layer and electron transport layer may be used.

For improving the charge transport performance to an extent such that the effect addressed in the present invention is not sacrificed, in any one of or both of the hole transport layer and the electron transport layer, a structure obtained by stacking thin films of a plurality of materials, or a thin film made of a mixture of a plurality of materials may be used. For improving the light emission performance, a structure including a thin film of at least one fluorescent material disposed between the hole transport layer and the electron transport layer, or the above structure in which any one of or both of the hole transport layer and the electron transport layer contain at least one fluorescent material can be used. In the above cases, for improving the light emission efficiency, a thin film for controlling the hole or electron transport can be further incorporated into the construction of layers in an embodiment.

As the electrode material for the cathode 4, an alloy of an active metal, such as Li, Mg, Ca, or the like and a metal, such as Ag, Al, In, and the like or a structure obtained by staking these metals on one another may be used. In the organic electroluminescence device which emits light from the side of the cathode, by selecting the thickness of the cathode, a light transmittance suitable for the desired application can be obtained.

Figure 3:
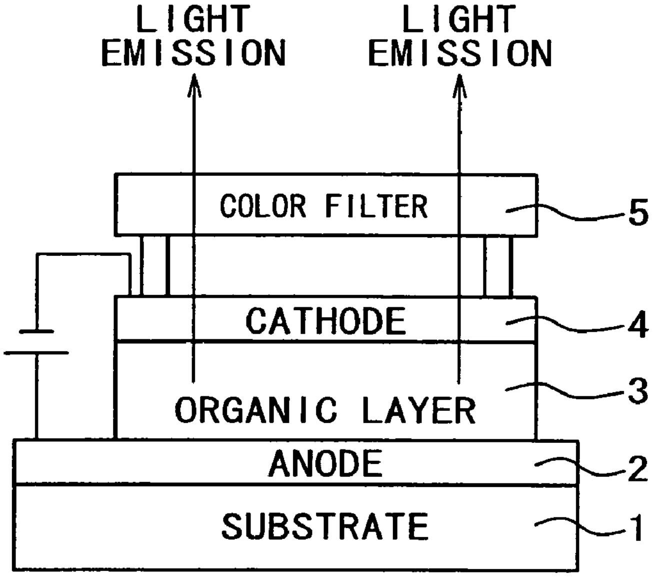
FIG. 3 is a diagrammatic cross-sectional view of another example of an organic electroluminescence device according to an embodiment of the present invention.

FIG. 3 is a diagrammatic cross-sectional view of an organic electroluminescence device having a construction such that a color filter 5 is provided on a cathode 4 to divide white light emitted from an organic layer 3 into RGB pixels as described below. In this case, by passing the white light emitted from the organic layer 3 through the color filter 5 which passes only light having a specific wavelength in RGB to cut off other wavelengths, the white light can be divided into RGB pixels.

In the above embodiment, an explanation is made on the so-called top emission type organic electroluminescence device which emits light from the side of the electrode on top, but the present invention is not limited to this type and may also be applied to a so-called bottom emission type organic electroluminescence device which emits light from the side of the electrode on bottom. The bottom emission type organic electroluminescence device includes, for example, a light transmitting anode made of an ITO or the like formed on a glass substrate, an organic layer having a light emission region formed on the anode, and a light reflecting cathode formed on the organic layer.

EXAMPLES

The organic electroluminescence device according to an embodiment of the present invention will be described below with reference to the following Examples, which are illustrative of the present invention and thus should not be construed as limiting the scope thereof.

Synthesis Example

A compound represented by the structural formula (3) above was synthesized by a Suzuki coupling method using 2,6-dibromopyrene and 1-Pyrene boronic acid in toluene-water in the presence of $Pd(PPh_3)_4$ (tetrakis(triphenylphosphine) palladium) and $Na_2CO_3$. The reaction formula for the synthesis is as follows.

(3)

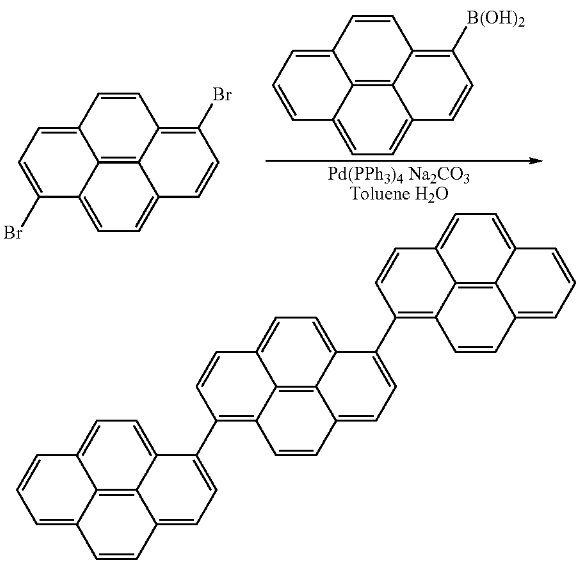

The resultant product was identified by a molecular ion peak (m/z 602) in a mass spectrum. A fluorescence spectrum of this compound in the form of thin film is shown in FIG. 1. Compounds represented by the structural formulae (4)

and (5) were individually synthesized in the same manner and used in the following Examples.

Example 1

The present Example is an example in which an organic electroluminescence device having a layered structure including a blue-light emitting layer made of a blue-light material and the compound represented by the structural formula (4) above was prepared.

First, a 30 mm×30 mm substrate having formed on one surface an anode made of a stacked film including an ITO layer was set in a vacuum deposition machine. The anode had the total thickness of 130 nm including layers of ITO of 20 nm, Ag alloy of 100 nm and ITO of 10 nm, starting from a side of the substrate. The substrate was a TFT substrate, which contain TFTs (Thin Film Transistors) for driving, covered with a planarized insulation film. On the anode, as a hole injection layer, m-MTDATA (4,4',4"-tris(3-methylphenylphenyl-amino) triphenylamine) represented by the structural formula below was deposited by a vacuum deposition method in a vacuum at $10^{-4}$ Pa or less so that the thickness of the resultant film was 10 nm. On the hole injection layer, α-NPD (N,N'-bis-(1-naphthyl)-N,N'-diphenyl-1,1'-biphenyl-4,4'-diamine) represented by the structural formula below was deposited as a hole transport layer material directly on the hole injection layer so that the thickness of the resultant film was 100 nm. The deposition rate was 0.1 nm/second.

m-MTDATA:

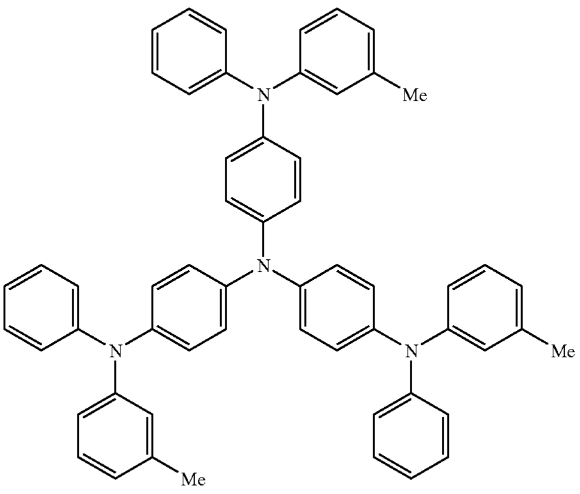

α-NPD:

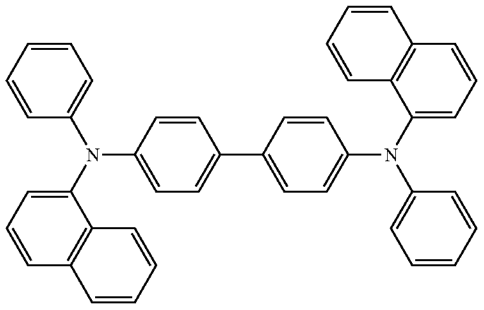

Subsequently, as a light emitting layer, DPVBi (4,4'-Bis (2,2-diphenyl-ethen-1-yl)-diphenyl) (emitting blue light) represented by the structural formula below was deposited directly on the hole transport layer so that the thickness of the resultant film was 10 nm.

EPVBi:

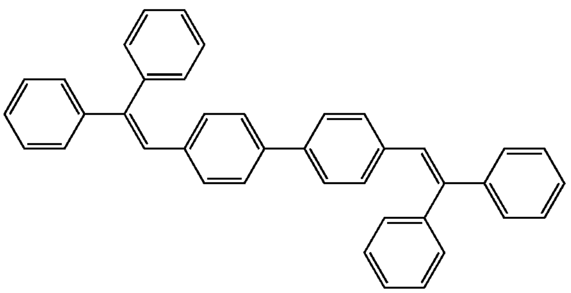

Then, the compound of the structural formula (4) was deposited directly on the DPVBi so that the thickness of the resultant film became 25 nm.

Next, $Alq_3$ {tris(8-hydroxyquinolinato)aluminum} of the structural formula below was deposited as an electron transport layer material at a deposition rate of 0.2 nm/second so that the thickness of the resultant film became 30 nm.

Alq3:

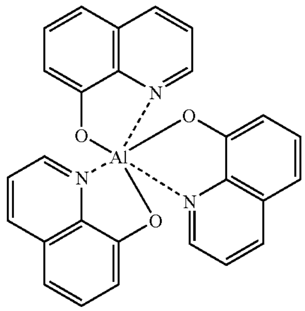

As materials for a cathode, Mg and Ag were used with a ratio of Mg:Ag=9:1, and they were co-deposited at a deposition rate of 1 nm/second so that the resultant film had such a thickness that it was able to transmit light, for example, 70 nm. On the cathode, a passivation film made of SiNx was formed. Furthermore, on the passivation layer, thermosetting resin was applied and a glass substrate was placed thereon. The cathode with these structures described above is heated for curing the thermosetting resin to complete sealing. As described above, an example of the organic electroluminescence device shown in FIG. 2 was prepared.

Figure 4:
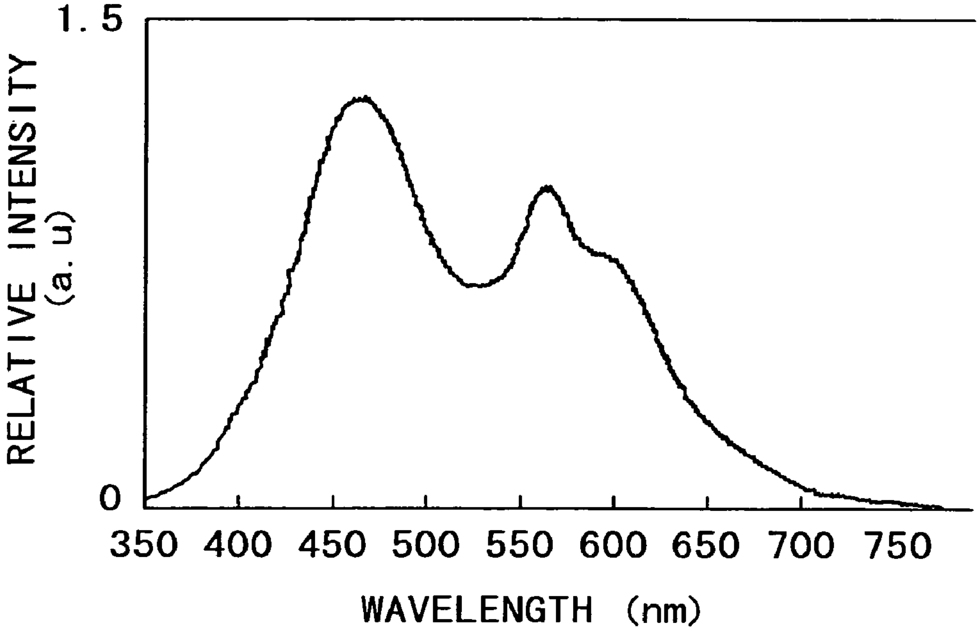
FIG. 4 is a diagram showing an emission spectrum of the organic electroluminescence device prepared in Example 1.

A forward bias direct voltage was applied to the thus prepared organic electroluminescence device in Example 1 in a nitrogen gas atmosphere to evaluate the light emission properties. The light emitted was white, and a spectrophotometry measurement offered a spectrum having emission peaks around 460 nm, 560 nm, and 600 nm shown in FIG. 4. In the spectrophotometry measurement, a spectrophotometer using a photodiode array, manufactured and sold by Otsuka Electronics Co., Ltd., as a detector was used.

In addition, a voltage-luminance measurement was carried out. The result shown in FIG. 5 was obtained, and a luminance of 1,000 cd/$m^2$ was obtained at 8 V. The emission efficiency was 6 cd/A.

The organic electroluminescence device prepared was allowed to stand in a nitrogen gas atmosphere for one month, but no deterioration was observed in the device. Further, a fixed current was permitted to flow through the organic electroluminescence device at an initial luminance of 500 cd/$m^2$ so that the device continuously emitted light and suffered forced deterioration. As a result, it was found that a 1,000-hour period of time was required until the luminance reduced by half.

Example 2

The present Example is an example in which an organic electroluminescence device using the compound represented by the structural formula (3) above as a dopant material was prepared. The doping concentration of the light emitting layer is not limited to that in the present Example.

First, a 30 mm×30 mm glass substrate having formed on one surface an anode made of a stacked film including an ITO layer and having a thickness of 100 nm was set in a vacuum deposition machine. On the anode, as a hole injection layer, the above m-MTDATA was deposited by a vacuum deposition method in a vacuum at $10^{-4}$ Pa or less so that the thickness of the resultant film became 10 nm. On the hole injection layer, the above α-NPD was deposited as a hole transport layer material directly on the hole injection layer so that the thickness of the resultant film became 100 nm. The deposition rate was 0.1 nm/second.

Subsequently, as a light emitting layer, the compound represented by the structural formula (3) above and the above DPVBi were co-deposited at, respectively, 0.02 nm/second and 0.2 nm/second directly on the hole transport layer so that the thickness of the resultant film was 40 nm.

Then, $Alq_3$ {tris(8-hydroxyquinolinato)aluminum} of the structural formula above was deposited as an electron transport layer material so that the thickness of the resultant film was 15 nm to form an electron transport layer. The deposition rate was 0.2 nm/second.

As materials for a cathode, Mg and Ag were used, and they were co-deposited at a deposition rate of 1 nm/second so that the thickness of the resultant film became 5 to 50 nm, thus preparing an organic electroluminescence device shown in FIG. 2.

A forward bias direct voltage was applied to the thus prepared organic electroluminescence device in Example 2 in a nitrogen gas atmosphere to evaluate the light emission properties. The light emitted was white, and a spectrophotometry measurement offered a spectrum having emission peaks around 470 nm, 550 nm, and 600 nm. In the spectrophotometry measurement, a spectrophotometer using a photodiode array, manufactured and sold by Otsuka Electronics Co., Ltd., as a detector was used. In addition, a voltage-luminance measurement was carried out. As a result, a luminance of 900 cd/$m^2$ was obtained at 8 V. The emission efficiency was 5 cd/A.

The organic electroluminescence device prepared was allowed to stand in a nitrogen gas atmosphere for one month, but no deterioration was observed in the device. Further, a fixed current was permitted to flow through the organic electroluminescence device at an initial luminance of 500 cd/$m^2$ so that the device continuously emitted light and suffered forced deterioration. As a result, it was found that a 1,300-hour period of time was required until the luminance reduced by half.

Example 3

The present Example is an example in which an organic electroluminescence device using a single film made of the compound represented by the structural formula (5) in the light emitting layer was prepared.

First, a 30 mm×30 mm glass substrate having formed on one surface an anode made of a stacked film including an ITO layer and having a thickness of 100 nm was set in a vacuum deposition machine. On the anode, as a hole injection layer, the above m-MTDATA was deposited by a vacuum deposition method in a vacuum at $10^{-4}$ Pa or less so that the thickness of the resultant film was 50 nm. On the hole injection layer, the above α-NPD was deposited as a hole transport layer material directly on the hole injection layer. The thickness of the hole transport layer made of α-NPD was 45 nm, and the deposition rate was 0.1 nm/second.

Then, as a light emitting layer, the compound represented by the structural formula (5) was deposited directly on the hole transport layer so that the thickness of the resultant film was 30 nm. Then, $Alq_3$ (tris(8-hydroxyquinolinato)aluminum) of the structural formula above was deposited as an electron transport layer material. The thickness of the electron transport layer made of $Alq_3$ was 35 nm, and the deposition rate was 0.2 nm/second.

As materials for a cathode, Mg and Ag were used, and they were co-deposited at a deposition rate of 1 nm/second so that the thickness of the resultant film about 5 nm to about 50 nm, thus preparing an organic electroluminescence device shown in FIG. 2.

A forward bias direct voltage was applied to the thus prepared organic electroluminescence device in a nitrogen gas atmosphere to evaluate the light emission properties. The light emitted was yellowish white, and a spectrophotometry measurement offered a spectrum having emission peaks around 450 nm, 550 nm, and 600 nm. In the spectrophotometry measurement, a spectrophotometer using a photodiode array, manufactured and sold by Otsuka Electronics Co., Ltd., as a detector was used. In addition, a voltage-luminance measurement was carried out. As a result, a luminance of 900 cd/$m^2$ was obtained at 8 V. The emission efficiency was 4 cd/A.

The organic electroluminescence device prepared was allowed to stand in a nitrogen gas atmosphere for one month, but no deterioration was observed in the device. Further, a fixed current was permitted to flow through the organic electroluminescence device at an initial luminance of 500 cd/$m^2$ so that the device continuously emitted light and suffered forced deterioration. As a result, it was found that a 700-hour period of time was required until the luminance reduced by half.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. An organic electroluminescence device comprising:

an organic layer having a light emission region that emits white light and being disposed between an anode and a cathode, wherein the organic layer contains, as an organic light-emitting material, a compound represented by a following formula (1):

(1)

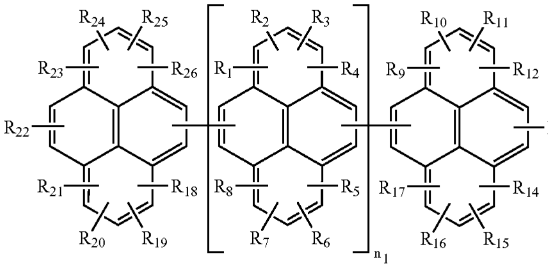

where each of $R_1$ to $R_{26}$ represents a substituent selected from the group consisting of a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, and a carboxyl group, and $n_1$ is a numeric value ranging from 1 to 3, wherein the compound emits white light or substantially white light.

2. The organic electroluminescence device according to claim 1, wherein each of $R_1$ to $R_{26}$ represents a substituent selected from the group consisting of a hydrogen atom, an alkyl group, an alkoxy group, an aromatic hydrocarbon group, and an aromatic heterocyclic group.

3. The organic electroluminescence device according to claim 2, wherein the organic electroluminescence device emits white light.

4. An organic electroluminescence device comprising:

an organic layer having a light emission region that emits white light and being disposed between an anode and a cathode, wherein the organic layer contains, as an organic light-emitting material, a compound represented by a following formula (2):

(2)

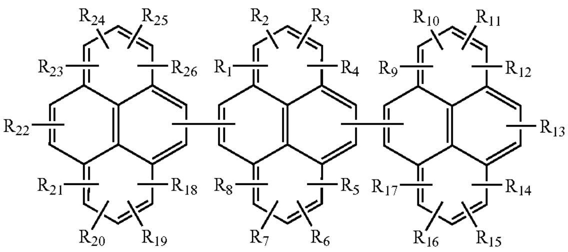

where each of $R_1$ to $R_{26}$ represents a substituent selected from the group consisting of a hydrogen atom, a halogen atom, a hydroxyl group, a mercapto group, a nitro group, an amino group, a cyano group, an alkyl group, an alkenyl group, a cycloalkyl group, an alkoxy group, an alkylthio group, a silyl group, an alkylsilyl group, a siloxanyl group, an aralkyl group, an aromatic hydrocarbon group, an aromatic heterocyclic group, an ester group, an aryloxy group, a formyl group, an alkoxycarbonyl group, and a carboxyl group, wherein the compound emits white light or substantially white light.

5. The organic electroluminescence device according to claim 4, wherein each of $R_1$ to $R_{26}$ represents a substituent selected from the group consisting of a hydrogen atom, an alkyl group, an alkoxy group, an aromatic hydrocarbon group, and an aromatic heterocyclic group.

6. The organic electroluminescence device according to claim 5, wherein the organic electroluminescence emits white light.

7. The organic electroluminescence device according to claim 4, wherein the compound has a following structural formula (3):

(3)

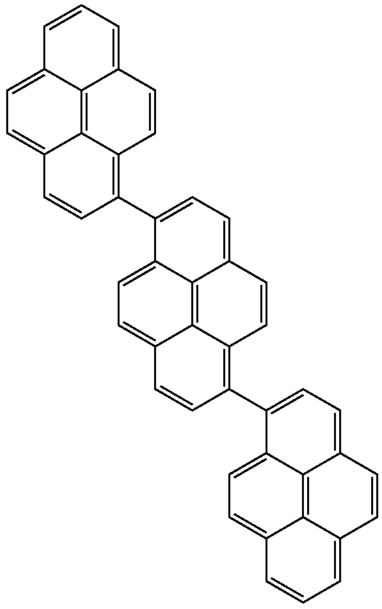

8. The organic electroluminescence device according to claim 4,
wherein the compound has a following structural formula (4):
(4)
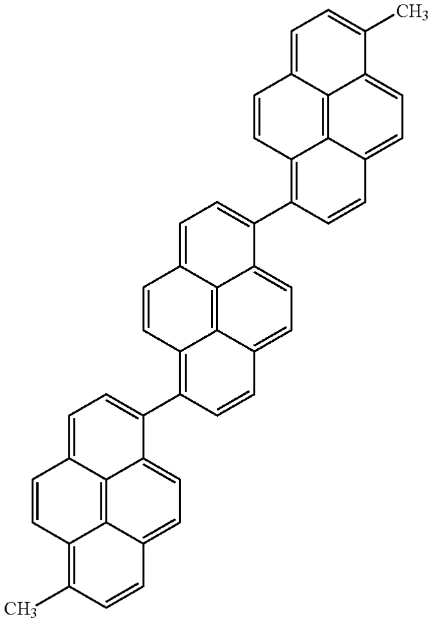
9. The organic electroluminescence device according to claim 4,
wherein the compound has a following structural formula (5):
(5)
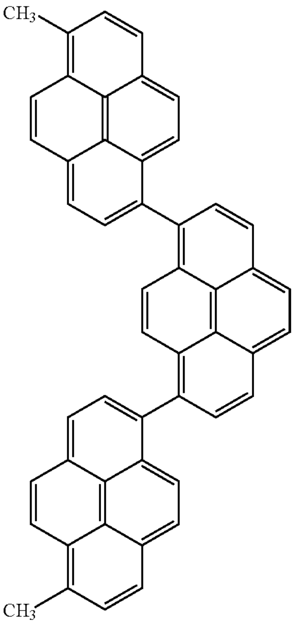
* * * * *